United States Patent

[11] 3,622,914

[72] Inventor Man Yung Chung
Seoul, Korea

[21] Appl. No. 879,226
[22] Filed Nov. 24, 1969
[45] Patented Nov. 23, 1971

[73] Assignee Korea Institute of Science & Technology
Cheong-Ryang Seoul, Korea

[32] Priority Feb. 21, 1969
[33] Korea
[31] 1969-234

[54] AMPLITUDE MODULATED CRYSTAL OSCILLATOR

10 Claims, 3 Drawing Figs.

[52] U.S. Cl. 332/56, 307/320, 332/52, 334/15, 331/36 C
[51] Int. Cl. H03c 1/14
[50] Field of Search 332/30 V, 26, 56, 31, 52; 331/36 C, 177 V; 307/320; 334/15

[56] References Cited

UNITED STATES PATENTS

| | | | |
|---|---|---|---|
| 2,925,563 | 2/1960 | Firestone | 332/26 |
| 3,020,493 | 2/1962 | Carroll | 332/30 V X |
| 3,068,427 | 12/1962 | Weinberg | 332/26 X |
| 3,119,079 | 1/1964 | Keizer | 332/56 X |
| 3,139,596 | 6/1964 | Johanson et al. | 331/177 V X |
| 3,154,753 | 10/1964 | Rusy | 332/56 X |
| 3,290,618 | 12/1966 | Leysieffer | 332/30 V |

*Primary Examiner*—Alfred L. Brody
*Attorney*—Finnegan, Henderson & Farabow

ABSTRACT: A circuit for producing amplitude modulated waves has a tuning circuit which is connected to the output of a crystal oscillator and which contains a voltage variable capacitance load, such as a semiconductor diode. The capacitance of the load is varied in response to a modulating signal to vary the impedance of the tuning circuit and thereby modulate the output signal of the oscillator.

INVENTOR
MAN YUNG CHUNG

Finnegan, Henderson & Farabow
ATTORNEYS

AMPLITUDE MODULATED CRYSTAL OSCILLATOR

The present invention concerns a circuit for producing modulated waves, and, more specifically, a circuit for obtaining amplitude modulated waves from a crystal oscillator.

In the prior art, crystal oscillator circuits have been developed which utilize vacuum tubes as power amplifiers. The frequency stability of the crystal oscillator circuits has been a problem because of the effects of thermionic current and interelectrode capacitance of the vacuum tubes on the operating characteristics of the oscillator circuits. This problem has usually been solved by interposing a buffer amplifier between the crystal oscillator and the power amplifiers. The power amplifiers have been used for both power amplification and modulation. With the development of the transistor, the vacuum tubes of the crystal oscillator circuits were merely replaced by appropriate transistors. There was, however, no modification in the circuit arrangement for performing amplification and modulation. The crystal oscillator circuits continued to include buffer amplifiers and power amplifiers, with the result that the power requirement of the circuits was not effectively reduced. Thus, it is desirable to provide a crystal oscillator circuit in which the output signal of the crystal oscillator is modulated without using a buffer amplifier or power amplifier to reduce power consumption in the circuit. This type of circuit is particularly useful in a mobile radio system.

In accordance with the present invention, a voltage variable capacitance load, such as a varactor diode, is located in the output tuning circuit of a crystal oscillator to control the amplitude of the oscillator output signals. The capacitance of the load is varied by a modulating signal, which in the case of a diode is a reverse bias voltage, to achieve the desired modulation of the oscillator output.

This invention is particularly useful for devices in which it is desirable to maintain power consumption at a low level. For example, the oscillator circuit of the present invention may be used in a portable transceiver. In this instance, the reduced power requirement of the oscillator circuit, in comparison with previously used vacuum tube and transistor circuitry, results in an increase in the length of time for which the transceiver is capable of operating on a given power supply.

The accompanying drawing illustrates a preferred embodiment of the invention and, together with the description, serves to explain the principles of the invention.

DESCRIPTION OF THE CIRCUIT

Figure 1:
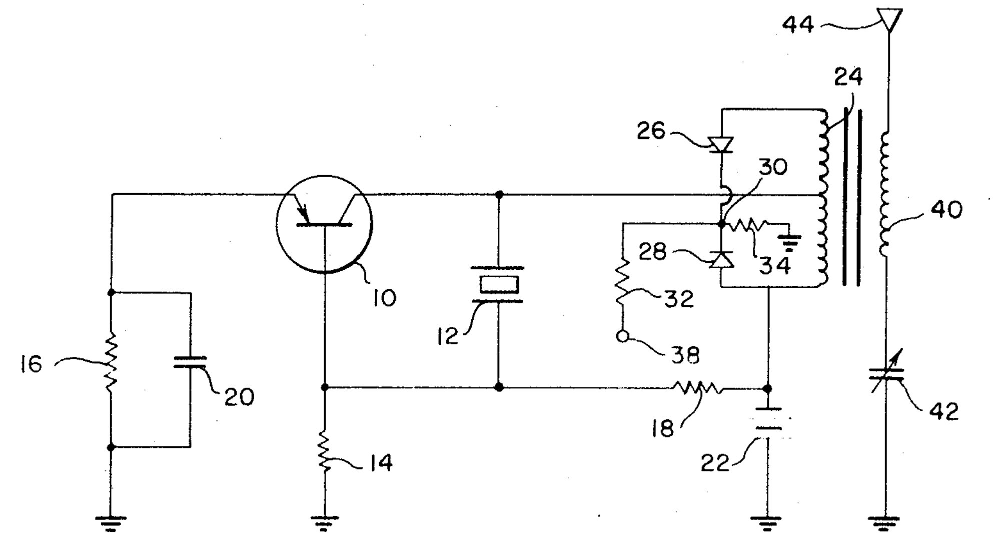
FIG. 1 illustrates the circuitry of a transceiver including a crystal oscillator having its output connected to a tuning circuit which incorporates voltage variable capacitance diodes.

In FIG. 1 there is shown a circuit for producing modulated waves. The circuit of the present invention includes oscillator means having an output for generating a periodic signal. As embodied and shown in FIG. 1, the circuit may be used in a device such as a transceiver which is capable of transmitting or receiving amplitude modulated waves.

The circuit includes a crystal oscillator which has a transistor 10 and a crystal 12 connected to the collector and base electrodes of the transistor. The oscillator also includes appropriate biasing resistances 14, 16, and 18 which are selected in accordance with the operating characteristics of transistor 10. A bypass capacitance 20 is connected in parallel with resistance 18 and the circuit is provided with a power source 22. The oscillator generates a periodic signal in the form of a sinusoid having a fixed frequency which is determined by crystal 12.

In accordance with the invention a tuning circuit is connected to the output of the oscillator. The tuning circuit includes an inductance having a center tap connected to the oscillator output and a voltage variable capacitance load. As embodied in this invention, the tuning or tank circuit has a center-tapped transformer winding or inductance 24 having its center tap connected to the output of the oscillator and a pair of unilaterally conductive semiconductor devices or diodes 26 and 28 which constitutes the voltage variable capacitance load. As shown in FIG. 1, diodes 26 and 28 are connected in series opposition across inductance 24. In a preferred embodiment, the cathode terminals of diodes 26 and 28 are connected together at a common terminal 30 and their anode terminals are connected to opposite ends of transformer winding 24. Diodes 26 and 28 are semiconductor diodes having a voltage variable capacitance which varies with reverse bias voltage. Such diodes are known as voltage variable capacitance diodes or varactors and utilize the variable capacitance that arises when a voltage difference is applied across a semiconductor barrier to enlarge the charge-depletion region of the barrier. It is a characteristic of voltage variable capacitance diodes that their capacitances vary with applied reverse bias voltage. In the oscillator circuit of the present invention, the capacitances of diodes 26 and 28 are varied in response to the voltage (reverse bias) applied at their common terminal 30.

In accordance with the invention there is further provided means for applying a modulating input signal to diodes 26 and 28 in the output tuning circuit of the oscillator. As embodied, this means comprises a pair of resistances 32 and 34 connected to common terminal 30 to form a resistance bridge. The resistance 32 is provided with a terminal 38 to which a modulating input signal may be applied, and the resistance 34 is grounded. When a modulating input signal is applied to terminal 38, a voltage proportional to that signal is developed at common terminal 30 and is applied to the cathode terminals of diodes 26 and 28.

In order that the circuit be capable of transmitting and receiving modulated waves it is provided with antenna circuitry including a second transformer winding 40 to which are connected an adjustable capacitance 42 and an antenna 44. Capacitance 42 is adjusted to tune the antenna circuitry to the frequency of the oscillator and antenna 44 is used to radiate the modulated waves.

Figure 2:
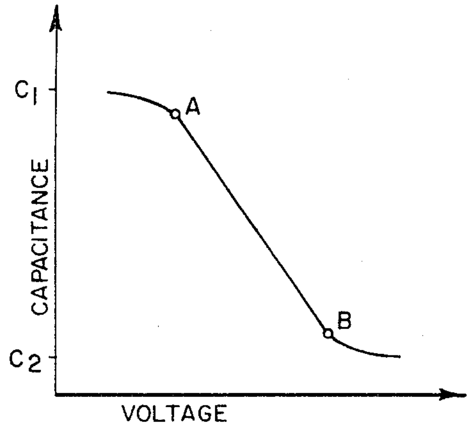
FIG. 2 is a graph illustrating the voltage-capacitance characteristic of the diodes.

In FIG. 2, there is shown the voltage-capacitance characteristic of a semiconductor diode for reverse bias voltages applied to the diode. At low-reverse bias voltages, for example, the capacitance of the semiconductor diode is relatively constant at a value $C_1$. As the voltage increases, however, the value of the capacitance of the diode passes through an approximately linear range of decreasing values between points A and B, as shown in FIG. 2, until at higher reverse bias voltages the capacitance again becomes relatively constant at a value $C_2$. Referring to FIG. 1, when positive modulating input voltages are applied at terminal 38, positive voltages proportional to the input voltages appear at common terminal 30 to reverse bias diodes 26 and 28 and vary the diode capacitances in accordance with FIG. 2.

Figure 3:
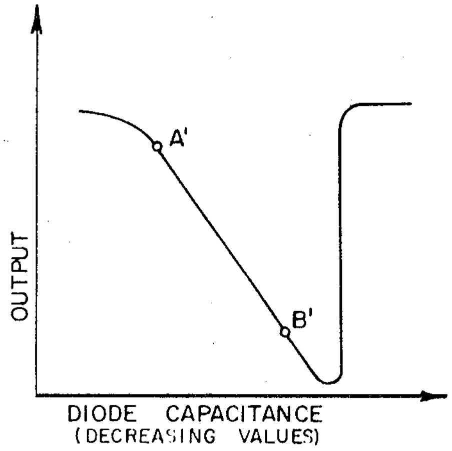
FIG. 3 is another graph showing the effect of the variable capacitance of the diodes on the output signal of the oscillator.

As further shown in FIG. 3, the capacitances of diodes 26 and 28 in the tuning circuit determine the amplitude of the output signal from the oscillator circuit which is applied to transformer winding 40 of the antenna circuitry. The horizontal axis of the graph of FIG. 3 represents increasing values of oscillator frequency or, since changes in oscillator frequency and diode capacitance have opposite effects on the amplitude of the oscillator output signal in the range between points A′ and B′, decreasing values of diode capacitance. The graph illustrates that the amplitude of the oscillator output is approximately linearly related to the diode capacitance in the range of values between points A′ and B′ (which correspond to points A and B, respectively, of FIG. 2). Thus, as long as the value of the diode capacitance is maintained in the range between points A′ and B′ (FIG. 3) the amplitude of the output of the oscillator circuit is approximately linearly proportional to the magnitude of the modulation input voltage.

OPERATION

In the operation of the circuit shown in FIG. 1, crystal 12 determines the frequency at which oscillation occurs. The oscillator produces a sinusoidal signal which is applied to the center tap of transformer winding 24, and the amplitude of this sinusoidal signal is determined by the impedance of the output tuning circuit. The impedance of the output tuning circuit is varied by changing the capacitance of diodes 26 and 28 in response to the modulating input voltage applied at terminal 38. Positive voltages applied at terminal 38 result in corresponding reverse bias voltages at common terminal 30 which vary the capacitances of diodes 26 and 28.

By varying the capacitances of diodes 26 and 28, the amplitude of the sinusoidal signal produced by the oscillator is modulated. The modulated sinusoidal signal is applied from transformer winding 24 to transformer winding 40 of the antenna circuitry and an amplitude modulated wave is radiated from antenna 44.

As shown in FIGS. 2 and 3, the amplitude of the oscillator output signal in the range of modulating input voltages between points A and B is large when the modulating input voltage has a low value and it is small when the modulating input voltage has a high value. In this range of voltages, a change in the amplitude of the oscillator output is approximately linearly proportional to a change in the modulating input voltage.

Since the oscillator circuit of this invention utilizes only a single transistor, the power requirement of the circuit is low relative to the power requirement of oscillator circuitry in which multiple amplification stages are used. Thus, by applying the modulating input signal directly to the tuning circuit of the crystal oscillator an economy is achieved in the power consumption of the oscillator circuit. This economy is particularly significant in the case of a portable device, for it enables the modulator circuit to operate (1) from a small power source or (2) for a longer time from a large power source.

A portable transceiver which utilizes the oscillator circuit of the present invention has a frequency stability which satisfies international standards established by the International Radio Consultative Committee (CCIR) of the International Telecommunications Union (ITU). Thus, the objective of providing a crystal oscillator circuit in which power consumption is decreased is achieved by the invention while preserving the necessary frequency stability in the operation of the transceiver.

The invention in its broader aspects is not limited to the specific details shown and described, and modifications may be made in the details of the oscillator circuit without departing from the principles of the present invention.

What is claimed is:

1. A circuit for producing amplitude modulated waves, which includes:
 oscillator means having an output for generating a periodic signal;
 a tuning circuit including an inductance having a center tap connected to said output of said oscillator means and a pair of unilaterally conductive semiconductor devices of variable capacitance connected in series opposition across said inductance; and
 means for applying a modulating input signal to said pair of unilaterally conductive semiconductor devices to vary the capacitance of said semiconductor devices and amplitude modulate the periodic signal generated by said oscillator means 2. The circuit of claim 1, wherein:
 said oscillator means comprises a crystal oscillator for generating a sinusoidal signal of a fixed frequency; and
 said pair of unilaterally conductive devices comprises a pair of diodes, the capacitance of which may be varied in response to a modulating input signal to amplitude modulate the sinusoidal signal.

3. The circuit of claim 2, wherein:
 said diodes are varactor diodes, and
 said modulating input signal is a reverse bias voltage applied to said diodes to vary the capacitance of said diodes.

4. A circuit for producing amplitude modulated waves, which comprises:
 oscillator means having an output for generating a periodic signal;
 a tank circuit including an inductance having a center tap connected to said output of said oscillator means and a voltage variable capacitance load comprising a pair of semiconductor diodes connected in series opposition across said inductance; and
 means for applying a modulating voltage to said load to vary the capacitance of said diodes and amplitude modulate the periodic signal generated by said oscillator means.

5. The circuit of claim, 4 wherein:
 said oscillator means comprises a crystal oscillator.

6. The circuit of claim 4, wherein:
 said pair of semiconductor diodes comprises a pair of varactor diodes having a capacitance which varies in response to the modulating voltage applied to said varactor diodes.

7. The circuit of claim 6, wherein:
 the modulating voltage applied to said varactor diodes is a reverse bias voltage which varies the impedance of said tank circuit.

8. A circuit for producing amplitude modulated waves, which includes:
 a crystal oscillator means having an output for generating a sinusoidal signal having a fixed frequency;
 a tuning circuit including a center-tapped inductance connected at its center tap to said oscillator output and a pair of voltage variable capacitance diodes having cathode terminals connected together at a common terminal and anode terminals connected to opposite ends of said inductance; and
 means for applying a modulating voltage to said common terminal to vary the capacitance of said diodes to modulate the amplitude of the sinusoidal signal generated by said oscillator means.

9. The circuit of claim 8, wherein:
 said voltage variable capacitance diodes are semiconductor diodes, the capacitances of which vary with the voltage of their cathode terminals.

10. The circuit of claim 9, wherein:
 the modulating voltage applied to said common terminal constitutes a reverse bias voltage for the semiconductor diodes.

* * * * *

UNITED STATES PATENT OFFICE
CERTIFICATE OF CORRECTION

Patent No. 3,622,914 Dated November 23, 1971

Inventor(s) Man Yung Chung

It is certified that error appears in the above-identified patent and that said Letters Patent are hereby corrected as shown below:

Claim 2, column 4, line 10, after "conductive" insert --semiconductor--.

Signed and sealed this 11th day of April 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334